62-79 SR
1/7/86 OR H 000,008

United States Statutory Invention Registration [19]

[11] Reg. Number: H8
[45] Published: Jan. 7, 1986

Hays

[54] THERMODYNAMIC WASTE HEAT TRANSFER SYSTEM

[75] Inventor: James E. Hays, Temple Hills, Md.

[73] Assignee: The Government of the United States, Washington, D.C.

[21] Appl. No.: 742,601

[22] Filed: Jun. 5, 1985

[51] Int. Cl.[4] ..... F25B 7/00
[52] U.S. Cl. ..... 62/79; 62/238.6

[56] References Cited

U.S. PATENT DOCUMENTS 3,507,320 1/1969 Russell ..... 165/26
4,340,030 7/1982 Molivadas ..... 126/44

OTHER PUBLICATIONS

1979 Equipment Handbook of the American Society of Heating, Refrigerating, and Air Conditioning Engineers (ASHRAE), pp. 34.14, 34.15, 34.16 and 34.17.

*Primary Examiner*—Edward A. Miller
*Attorney, Agent, or Firm*—Robert F. Beers; William T. Ellis; Andrew M. Lesniak

[57] ABSTRACT

A thermodynamic waste heat transfer system including a refrigerant working fluid, an evaporator to absorb waste heat from a source, especially a communication transmitter, and a condenser to discard the waste heat. The fluid enters the evaporator in liquid form, boils in the evaporator, migrates in gaseous form upward to the condenser, returns to liquid form in the condenser, and returns via gravity to the evaporator. Refrigerant R-114 is the preferred fluid. The evaporator is mounted on the source to catch hot exhaust air carrying waste heat from the source which waste heat is discarded via the condenser into ambient air outside a closed building containing the source. Because the evaporator is at a lower elevation than the condenser no pump is needed, primary action producing desired flow of the refrigerant.

16 Claims, 2 Drawing Figures

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

THERMODYNAMIC WASTE HEAT TRANSFER SYSTEM

BACKGROUND OF THE INVENTION

This invention relates to a thermodynamic system for effectively and economically removing waste heat from space within a building or other enclosed structure containing a source of the waste heat. The system may comprise one or more communication transmitters, for transferring the heat to another location outside the structure where the heat is discarded, or dumped, into the ambient air.

In particular, this invention relates to a system for accomplishing removal of considerable waste heat from space containing large communication transmitters by conveying the heat to another location. If further heat removal or cooling is desired to supplement the basic thermodynamic action of the system, a conventional air conditioner of relatively small cooling capacity can be set into operation to provide total cooling otherwise available only from a much larger air conditioner. The system alone in many applications can handle all of the waste heat plus the normal building heat load.

The present Naval Facilities Engineering Division criteria for the environmental control of communication transmitter facilities requires ventilation to carry away the waste heat produced by the facility transmitters. Concurrently, the operator of the transmitter facility is provided an acceptable working environment by the expedient of separating the front, or operator side, of each transmitter from the rear and top sides of each transmitter by a solid partition that forms a corridor between two rows of transmitters that face each other. The corridor is air conditioned while hot air (waste heat) is exhausted from the top of each transmitter and ventilating air passes through intake apertures in the side of each transmitter. The space behind each transmitter row is used primarily as an air plenum. This entire arrangement has become known as the "plenum system". As compared to a system where the transmitters occupy space in any arrangement (not necessarily in facing rows) and where the waste heat is discharged into the space occupied by an operator which is fully air conditioned to remove heat from the space, the plenum system is much less costly in both first cost and operating cost. The plenum system, however, is not a panacea, and has certain drawbacks and limitations, to wit, (1) It requires a building configuration that contains a number of long, narrow wings so that outside air in large quantities can be admitted (i.e., forced-by-fans) into the plenum space behind each row of transmitters. A building of this configuration is not economical on a square foot basis; (2) With the front faces of the transmitters protruding into an air conditioned corridor and with the inside of each transmitter being flushed with the unconditioned outside air that often contains large quantities of moisture (high humidity); condensation of water from the air becomes a problem. This situation requires careful limitations on how cool the conditioned corridor can become and an environment tempering arrangement for the ventilating air where some of the waste heat in the exhaust air is used to warm the incoming air by throttling the quantity of outside air and mixing the remainder with some of the waste heat to prevent high humidities. This method of avoiding condensation of moisture from air is not well understood by the transmitter operators since it requires an understanding of the psychometric properties of air. As a result, the usual thinking is (a) the cooler the better, and (b) the more ventilation the better. The result of this thinking is that some transmitters have been found with an inch of water collected in the bottom. This, of course, is a situation that becomes much worse, with further water collected, when a transmitter is turned off for maintenance purposes and access panels are removed to provide openings into the corridor of opposed transmitters. (3) Access for maintenance is quite limited since one must move from the front of a transmitter to one end of the corridor, then through a door into the plenum and on to the rear of the transmitter to be serviced. (4) Much of the transmitter maintenance is accomplished through access panels on the rear of a row of transmitters. This means that work must be done in the unconditioned plenum that is elevated in temperature from heat supplied by the outside air and supplied by the operation of the other transmitters sharing the plenum and, if properly operated, from tempering that is supposed to maintain a plenum temperature of 90° Fahrenheit regardless of outside air temperatures that may be below 90° Fahrenheit. Although operators will debate the findings, it has been technically established that the transmitters which are procured to meet MIL-E-16400 and a temperature of 122° Fahrenheit (50° C.) will operate fine at 90° Fahrenheit, a value that gives a large margin of safety for transmitter operation, and which temperature is 5° Fahrenheit above the worst dew point found anywhere in the world per MIL-STD-210, "Climatic Extremes for Military Equipment." To this day no plenum system has ever worked for very long due to well intentioned but misguided tampering with control settings by operators. (5) The large quantities of air necessary to carry the waste heat out of the plenum must be filtered to a reasonable degree to remove dust, insects and other contaminants. This requires many filters that occupy much of the outside wall area of the building housing the transmitters. It has been found that throwaway filters, although cheap, are marginally adequate for the job and somehow never seem to be in stock when needed. Cleanable filters, usually metal, never get cleaned and oiled due to lack of manpower and some rust and corrode away from the combined effects of dirt and moist air. Many ventilating systems are either choked for air or are operating without filters.

The present invention provides a primary waste heat transfer system that will permit the use of any building configuration for a facility of communication transmitters, or comparable heat generating equipment; permit easier access to the transmitters, or comparable equipment, and will result in a closed-to-the-outside air, fully-air-conditioned-inside environment that will result in much less transmitter maintenance, better retention rate for experienced technician operators, a first and operating cost for the system comparable to ventilation and much less costly than 100 percent full air conditioning both in first and operating cost.

So-called thermosiphon heat exchanger systems are known and are briefly described on pages 34.14 through 34.17 of the 1979 Equipment Handbook of the American Society of Heating, Refrigerating, and Air-Conditioning Engineers, Inc. (ASHRAE). Two types of such systems exist, and are discussed on pages 34.14 through 34.17. The coil loop thermosiphon depicted in FIG. 31 on page 34.16 consists of a refrigerant working fluid which circulates in a closed-loop path between similar heat exchange units which may be designated respectively as an evaporator unit and as a condenser unit. This type of system achieves a thermosiphon action characterized by heat absorption as the working fluid evaporates in one unit and by heat release as the working fluid condenses in the other unit. The net result is heat transfer from one location to another.

So far as the applicant is aware, the above-described thermosiphon heat exchanger system is not in use today even though it has attractive simplicity. Possible reasons for the nonuse of such a system are many. One possible reason is that most, if not all, existing applications for such a system are inherently inefficient and the evolution of air conditioning technology has seen the use of various pumps, etc. to transfer heat from a space to be cooled (e.g., a warm room in summer) to another location (e.g., outside a home) where the heat is released. Such a system operates within certain well defined parameters of temperature and pressure and requires use of a refrigerant that does not consume much space so that compactness of the air-conditioning unit is attained. Such a system goes unused in winter time when the desired result is to transfer heat from the cold outside to the warmer inside of a room in a house, for example. Such a system could not perform the function of the present invention which is used to transfer very large quantities of waste heat from a localized source inside an enclosed structure when the outside air is either warmer or cooler than the inside air.

Heat pumps are known devices that may be said to transfer heat from outside to an indoor location and differ from the present system which transfers waste heat from an indoor location to an an outside location.

Automobile passenger compartment air conditioning systems remove heat from a passenger compartment. These systems utilize a compressor pump and could not utilize the present invention which does not utilize a pump nor a comparable refrigerant.

Systems shown in U.S. Pat. Nos. 3,507,320 and 4,340,030 do not perform the same function performed by the novel thermodynamic system of the present invention, although various components of the new system have been known for many, many years. U.S. Pat. No. 4,340,030, for example, discloses a solar heating system that employs a flooded evaporator, a condenser, a refrigerant reservoir, and a pump. A variation of this system dispenses with the pump when the system piping lies in one horizontal plane. U.S. Pat. No. 3,507,320, for example, discloses a heating and cooling system utilizing heat from a lighting system and does not disclose a thermodynamic waste heat transfer system.

SUMMARY OF THE INVENTION

It is an object of the present invention to provide a thermodynamic system for removing considerable waste heat from heat-producing electronic equipment to be protected against thermally induced degradation, impairment, or malfunction.

It is a further object of the invention to provide a simple, economic and efficient thermodynamic heat transfer system including a refrigerant working fluid that undergoes successive changes between liquid and gas phases to remove heat from one location and to transfer the heat to another remote location.

The present invention provides a thermodynamic system comprising two heat exchangers, specifically an evaporator and a condenser. The evaporator is mounted over the exhaust port of a transmitter where an airstream of hot exhaust air, typically at 220° F., is directed at the evaporator. The condenser is located elsewhere at a higher elevation than the elevation of the evaporator. Outside (out-of-doors) air is driven through the condenser to remove the heat from the system. Thermodynamic action occurs as a working fluid changes phase from liquid to gas and vice versa. Waste heat boils the fluid in the evaporator, the fluid becomes gas which migrates through a pipeline up to the condenser where heat is removed from the system, and the gas cools and condenses to a liquid which drains by gravity from the condenser back to the evaporator. The evaporator is at a lower elevation than the condenser. A pump may be, but need not be, introduced into the system, and in such a case, the evaporator need not be below the condenser elevation as the pump can be used to help lift the working fluid as needed.

In the preferred embodiment of the invention, the preferred working fluid is refrigerant R-114, the source of waste heat is one or more communication transmitters, the system includes one or more evaporators suitably connected via piping to a condenser, the condenser elevation is higher than the evaporator elevation, and each evaporator is mounted on top of a respective transmitter near an exhaust port to catch the hot exhaust air as it leaves the transmitter.

DETAILED DESCRIPTION OF THE INVENTION

Figure 1:
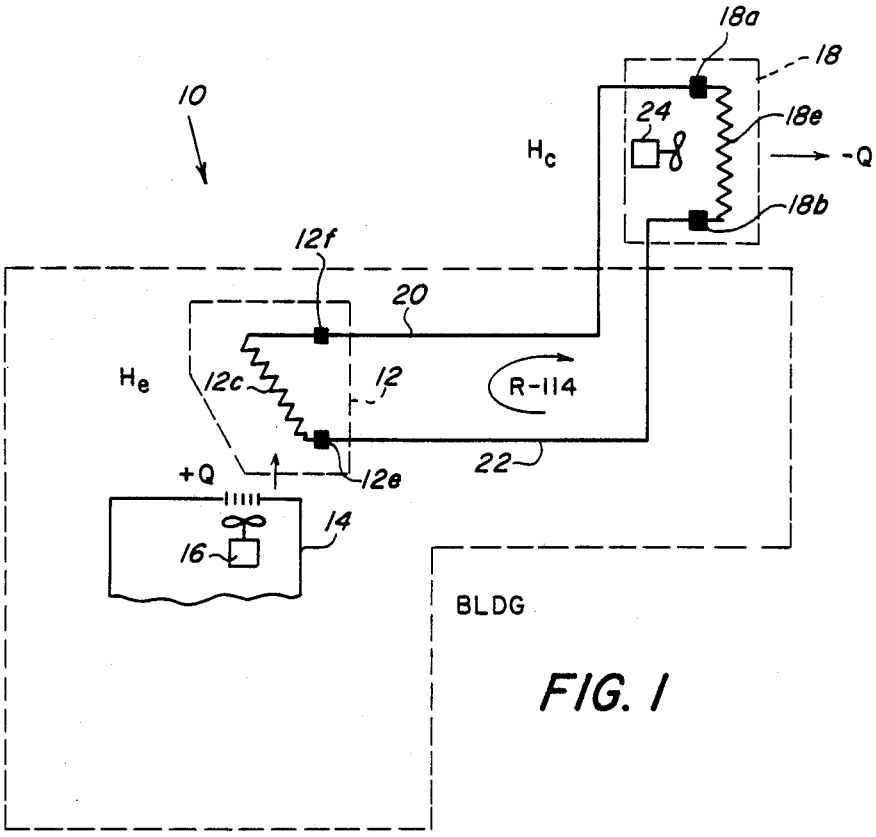
FIG. 1 is a schematic diagram of various components of a system constructed in accordance with the present invention.

The present invention can be best understood through reference to the accompanying drawing. Referring now to FIG. 1, the present invention relates to a system 10 including an evaporator 12 for absorbing waste heat, +Q, from a communication transmitter 14 containing a fan 16 for directing an airstream of hot air, as indicated by an arrow, from a transmitter exhaust port toward the evaporator 12. The evaporator 12 is mounted over the exhaust port at the top of the transmitter 14. System 10 includes a condenser 18 atop a closed building BLDG containing the transmitter 14 and the evaporator 12. Fluid lines 20 and 22 interconnect the devices 12 and 18. A condenser fan 24 blows an airstream of hot air containing heat, −Q, away from the condenser 18 into the ambient air above the building BLDG.

Figure 2:
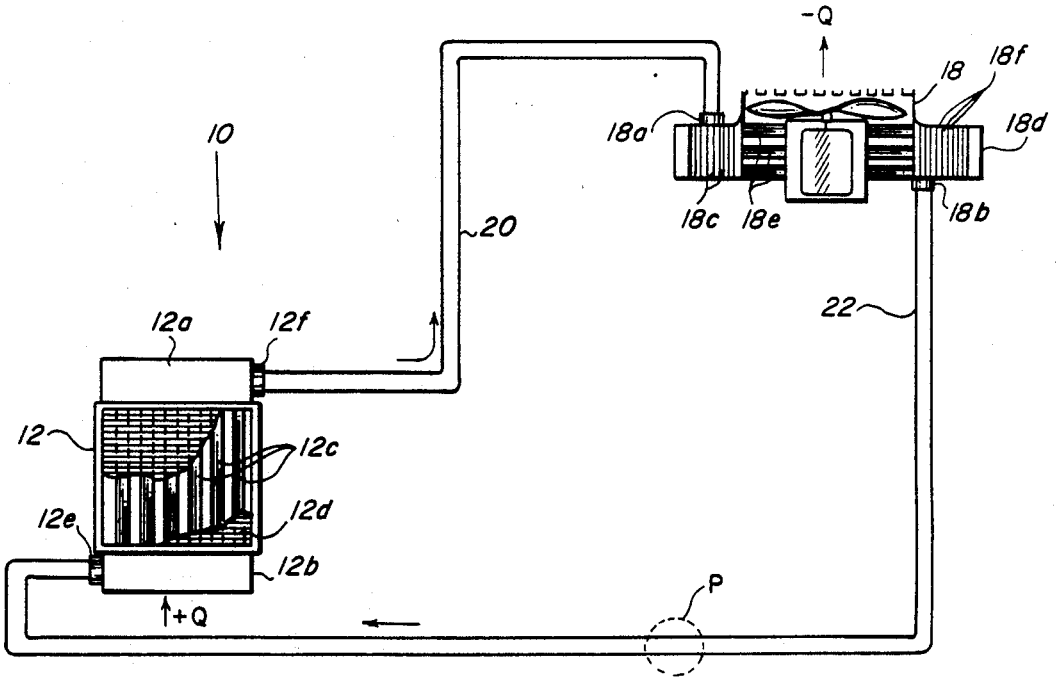
FIG. 2 is a detailed diagram of one specific, preferred embodiment of the present invention.

Referring now to FIG. 2, the evaporator 12, sometimes called a coil, includes top and bottom manifolds **12*a* and 12*b*, a plurality of vertically slanted tubes, or tubing, 12*c*, and horizontally slanted fins 12*d* for aiding heat transfer into the tubing 12*c*. Manifold 12*b* has an inlet port 12*e* and manifold 12*a* has an outlet port 12*f*. The heat +Q causes a working liquid in the evaporator 12 to boil, forming gas that leaves the evaporator 12 via port 12*f*. The working liquid enters the evaporator 12 via inlet port 12*e***.

Fluid line 20 connects the evaporator outlet port **12*f* to an evaporator inlet port 18*a*, at the top of the condenser 18. Fluid line 22 connects a condenser outlet port 18*b* to the condenser inlet port 12*e*. Condenser manifolds 18*c* and 18*d* are interconnected by circular, horizontal tubes 18e. A fan 24 at the center of the tubes 18e blows hot air upward, away from vertical heat transfer fins 18e. As a result, heat, $-Q$, leaves the system 10 via condenser 18**.

Gas coming into the condenser inlet port 18a condenses within the tubes 18d into a liquid that leaves the condenser 18 via fluid outlet port 18b. The fluid flows by gravity down from the condenser 18 to the evaporator 12 via fluid line 22, as the elevation, $H_e$, of the evaporator 12 is lower than the elevation, $H_c$, of the condenser 18. No pump is used or needed in this system.

If the evaporator 12 were not at a lower elevation than the condenser 18 as above described, then a pump, indicated by a circular dotted line P, could be connected into the piping 20, 22 of the system 10 to assist the essential thermodynamic action of the liquid/gas and gas/liquid phase changes that characterizes the present invention.

The working fluid for the system is very carefully selected to achieve the desired results. For optimum results, the preferred fluid is the less commonly known refrigerant R-114 or dichlorotetraflouroethane, chemically described as $C_2Cl_2F_4$ or as $CClF_2CClF_2$. This fluid has the following properties:

a. Saturation temperature at OPsig=39° F. Therefore, at working temperatures above 39° F. it will outgas and not be contaminated with noncondensible gas (air or water vapor) when minor leaks occur during normal operation.

b. Saturation pressure at 115° F. (highest likely to the encountered)=43.411 Psig, which allows the use of low pressure piping.

c. Enthalopy difference at 115° F.=51.3 btu/lb latent change.

The low pressures at the working temperatures and the low solvent effect of R-114 on elastomers and plastics permits the use of lightweight, low cost, nonconductive piping. Low toxicity and nonflammability make R-114 a safe refrigerant.

R-114 has temperature and pressure properties that make it suitable for one system application described supra. The safe nature of R-114, which not only is nonflammable and nontoxic, but also is nonactive with respect to corrosive and solvent action, makes it attractive to use. Should a leak occur in the system 10, R-114 at system temperatures will not cause injury to anyone who may accidentally happen to come into contact with it.

R-114 is the preferred refrigerant. Other refrigerants share somewhat similar characteristics and properties. R-113, trichlorotrifluoroethane, chemically defined as $CCl_2FCClF_2$, and R-11, trichlorofluoromethane, chemically defined as $CCl_3F$ are alternate refrigerants that can be used, but with nonoptimum results. Other less similar refrigerants may be used if certain characteristics, such as nontoxicity, are unneeded.

Any suitable working fluid can be used. Typical of these are refrigerants known specifically by ASHRAE AS R-114, R-113, or R-11. R-114 has been found to have the most advantageous qualities in terms of (1) operation above atmospheric pressure, (2) operation at low pressure, (3) non-toxicity, (4) non-flammability, and (5) low solvency, thereby allowing use of low cost plastic pipelines. R-114 yields optimum results for the application described hereafter.

In the operation of the system 10, the evaporator 12, as aforesaid, utilizes the waste heat of a transmitter 14 to convert the fluid refrigerant FREON R-114 from a liquid phase to a gas phase. This latent change-of-state feature permits the evaporator 12 to be quite small and efficient at heat transfer. Low system pressures are involved, hence the evaporator 12 is of the "flooded" type and it is kept full of liquid R-114. Since no mechanical pump is needed or used to raise the gaseous R-114 boiling up from the evaporator 12 via line 20 to the condenser 18, there is no need to lubricate a pump, and there is no possible contamination of the condenser 18 by a lubricant. The condenser 18 cools the gaseous refrigerant below its dewpoint temperature at the corresponding condensing pressure, and the refrigerant returns to its liquid phase.

The condenser 18 is unique as it works at low pressures and, accordingly, has larger passage tubes than might be considered normal, to ensure a lower resistance to fluid flow. A standard compressed-air aftercooler has the desired qualities and can be used as purchased without modification. Specifically, the applicant has used an AV cooler manufactured by Young Radiator Company and described in its catalog 14-81. U.S. Pat. No. 2,504,798 reportedly relates to the design and use of such coolers. The condenser 18, however, can be of any suitable design.

At the evaporator 12, a throttling valve (not shown) can be, but need not be, used to prevent overfilling of the evaporator 12 with R-114 or other refrigerant. This valve would function as an expansion valve, that, due to the low pressures involved, would include a large sized, motorized butterfly valve flap. A liquid level sensing device (not shown) can be, but need not be, used to control the valve action.

Typically, the condenser fan 24 is much larger than the evaporator or exhaust fan 16 because the condenser 18 will be interconnected with more than one evaporator 12. In a typical application, there is one evaporator per transmitter, and six evaporators per condenser with each evaporator connected directly to the one condenser with all of the evaporators parallel-connected to the condenser.

Experimental results involving a small scale developmental system constructed to determine an optimum configuration for the system have demonstrated system capability. More recent construction effort on a full scale system for Navy use at a large, multiple transmitter facility in a closed building is expected to result in large cost savings when the system is put into operation.

Large Navy communication transmitters indeed release large quantities of waste heat in the form of hot exhaust gas. In terms of air conditioning load, this waste heat equates to about 4¼ tons for each AN/FRT-39 or AN/FRT-84 transmitter and 15 tons for each AN/FRT-40 or AN/FRT-85 transmitter. With many transmitter facilities, operational costs for conventional heat removal quickly rise as several hundreds of tons of cooling need is created. In an average multiple transmitter facility, this cost can amount to many thousands of dollars per annum. With the present invention, much of this cost can be avoided.

For a typical large transmitter facility that has 1600 kilowatts of waste heat, or 5,460,800 BTU/hr, 100% air conditioning would require 455 tons. To this must be added another 25 tons or more for building loads and 160 tons for backup capacity, for a total of 640 tons. At about $2000 per ton the first cost of installing such a system would be $1,280,000. At 1.3 HP per ton, 746 watts per HP, $0.15 per KWH, 24 hrs per day, 365 days per year, the operating cost per year equals $611,672.

For a ventilation system (the plenum system) 54,608 CFM at $4.00 per CFM, involving a 100° F. temperature difference (td) and 455 tons, the cost would be $218,432. Fifty-five filters at $16 per filter costs $880. This $880 is both an initial cost and is the cost of each filter change. 200 HP is required to move air at this facility. At 200 HP, 746 watts per HP, $0.15 per KWH, 24 hours per day, 365 days per year, the cost is $196,049 per year.

The system of the present invention at $410 per ton for 455 tons costs $186,550. Added air conditioning at $2000 per ton for 100 tons costs $200,000, to bring the total initial cost to $386,550. Annual operating cost for the waste heat transfer system is $67,637 (46 cond.×1.5 HP×746/1000×0.15×24×365) and annual operating cost for the air conditioning is $127,432 (100×1.3×746/1000×0.15×24×365), for a total annual cost of $195,069.

Thus, a system using the present invention, together with conventional air conditioning, costs a little more than a ventilating system initially but only 30 percent of the cost of 100 percent of the cost of 100 percent air conditioning (i.e., where the invention is not used.) The operating cost of a system is about the same as that of a ventilating system at locations where the augmenting air conditioning would have to run all of the time. At many locations it would not and evan greater savings would be realized. However, even at full operation the operating cost is $416,600 less per year than 100 percent air conditioning while providing the same benefit as 100% air conditioning. This significant savings in operating costs alone does not include the savings in maintenance on the transmitters and the worth of improved morale for the operators.

While the invention has been particularly shown and described with reference to specific embodiment, it will be understood by those skilled in the art that various changes in form and detail may be made thereto without departing from the spirit and scope of the claims annexed hereto.

What is claimed and desired to be secured by Letters Patent of the United States is:

1. A primarily thermodynamic waste heat transfer system comprising, in combination:
   - an evaporator at a first elevation;
   - a condenser at a second elevation;
   - piping connecting said evaporator and said condenser into an uninterrupted fluid path so that refrigerant may circulate between said evaporator and said condenser;
   - a preselected refrigerant in said evaporator, condenser, and piping;
   - a source of waste heat near said evaporator, hot exhaust air from said source carrying said waste heat toward said evaporator to thereby cause said refrigerant in said evaporator to change from a liquid to a gas phase; and
   - means for removing heat from said refrigerant in said condenser to cause said refrigerant in said condenser to change from a gas to a liquid phase;
   - whereby a primary thermodynamic cycle is established in which waste heat added to the refrigerant at said evaporator is removed from the system at said condenser without using a pump to assist said primary thermodynamic cycle.

2. A system in accordance with claim 1, wherein said refrigerant is nontoxic and nonflammable.

3. A system in accordance with claim 2, wherein said refrigerant contains dichlorotetrafluoroethane or similar substance.

4. A system in accordance with claim 2, wherein the refrigerant contains trichlorofluoroethane.

5. A system in accordance with claim 2, wherein the refrigerant contains trichlorofluoromethane.

6. A system in accordance with claim 1, wherein said first elevation is lower than said second elevation, thereby not requiring a pump to return the liquid refrigerant to said evaporator and resulting in a system devoid of any pump.

7. A system in accordance with claim 1, wherein said waste heat is provided by one or more communication transmitters in operation.

8. A primary thermodynamic waste heat transfer system for transferring waste heat from a source comprising at least one communication transmitter, or comparable equipment, said system comprising, in combination:
   - at least one evaporator at a first elevation;
   - a condenser at a second elevation higher than said first elevation;
   - piping connecting said at least one evaporator and said condenser into at least one uninterrupted continuous fluid path so that refrigerant may circulate between said at least one evaporator and said condenser;
   - a preselected nontoxic, nonflammable refrigerant comprised of dichlorotetrafluoroethane or similar substance contained in said fluid path;
   - at least one source of waste heat including at least one communication transmitter, or comparable equipment, there being a respective evaporator associated with each respective communication transmitter, or comparable equipment;
   - said at least one evaporator being mounted upon said at least one communication transmitter, or comparable equipment, to catch hot exhaust air carrying waste heat from said at least one communication transmitter, or comparable equipment;
   - waste heat absorbed by said refrigerant in said at least one evaporator causing said refrigerant to change from a liquid to a gas phase,
   - waste heat released by said refrigerant in said condenser causing said refrigerant to change from a gas to a liquid phase; and
   - means for removing waste heat from said refrigerant in said condenser;
   - whereby a primary thermodynamic cycle is established in which waste heat from said at least one communication transmitter, or comparable equipment, is transferred via a primary thermodynamic action to said condenser which discards said waste heat into ambient air.

9. A system in accordance with claim 8, wherein said at least one evaporator includes two or more evaporators for a comparable number of transmitters, or comparable equipment, and wherein each of said two or more evaporators is suitably interconnected to said condenser via piping.

10. A method of transferring waste heat from at least one communication transmitter, or comparable equipment, in operation, the method comprising the steps of:
   - circulating a preselected, nonflammable refrigerant in at least one uninterrupted continuous fluid path defined by piping interconnecting an evaporator at a first elevation to at least one condenser at a second elevation higher than said first elevation;

evaporating said refrigerant at said evaporator by positioning said evaporator near at least one communication transmitter, or comparable equipment, to catch hot exhaust air carrying waste heat from said at least one communication transmitter, or comparable equipment;

condensing said refrigerant at said second elevation in said condenser;

utilizing said refrigerant to absorb waste heat contained in hot exhaust air provided by said at least one communication transmitter, or comparable equipment, to cause said refrigerant in said evaporator to change from a liquid to a gas that migrates to said second elevation;

utilizing condensation of said refrigerant in said condenser to remove waste heat from said refrigerant, to release said waste heat into ambient air, and to cause said refrigerant to change from a gas to a liquid at said second elevation;

thereby establishing a thermodynamic cycle in which waste heat added to said refrigerant at said first elevation is removed from said system at said second elevation while said refrigerant circulates through said fluid path.

11. A method in accordance with claim 10, wherein said refrigerant is nontoxic and nonflammable.

12. A method in accordance with claim 10, wherein said refrigerant comprises dichlorotetrafluoroethane or similar substance.

13. A method in accordance with claim 10, wherein said refrigerant comprises trichlorofluoroethane.

14. A method in accordance with claim 10, wherein said refrigerant comprises trichlorofluoromethane.

15. A method in accordance with claim 10, wherein a pump to return liquid refrigerant from said evaporator to said at least one condenser is not utilized.

16. A method in accordance with claim 10, wherein said at least one evaporator comprises two or more evaporators for a like number of communication transmitters, or comparable equipment, and wherein each of said two or more evaporators is suitably interconnected to said condenser via piping.

* * * * *